(12) United States Patent
Huisman et al.

(10) Patent No.: US 7,820,999 B2
(45) Date of Patent: Oct. 26, 2010

(54) ELECTRONIC ARRANGEMENT INCLUDING A THIN FILM TRANSISTOR HAVING ACTIVE AND PROTECTIVE LAYERS STRUCTURED IN A SAME TWO-DIMENSIONAL PATTERN

(75) Inventors: Bart-Hendrik Huisman, Eindhoven (NL); Maria Estrella Mena Benito, Eindhoven (NL); Thomas Cleophas Theodorus Geuns, Eindhoven (NL)

(73) Assignee: Polymer Vision Limited, Eindhoven (NL)

( * ) Notice: Subject to any disclaimer, the term of this patent is extended or adjusted under 35 U.S.C. 154(b) by 0 days.

(21) Appl. No.: 10/547,591

(22) PCT Filed: Feb. 26, 2004

(86) PCT No.: PCT/IB2004/050154

§ 371 (c)(1),
(2), (4) Date: Sep. 1, 2005

(87) PCT Pub. No.: WO2004/079833

PCT Pub. Date: Sep. 16, 2004

(65) Prior Publication Data

US 2006/0220126 A1 Oct. 5, 2006

(30) Foreign Application Priority Data

Mar. 7, 2003 (EP) ................................. 03100574

(51) Int. Cl.
*H01L 35/24* (2006.01)
*H01L 51/00* (2006.01)
(52) U.S. Cl. .................................. 257/40; 257/E51.001
(58) Field of Classification Search .................. 257/40, 257/347; 438/82, 99
See application file for complete search history.

(56) References Cited

U.S. PATENT DOCUMENTS

| 5,281,489 | A  | * | 1/1994 | Mori et al. ................... 428/690 |
| 5,500,537 | A  | * | 3/1996 | Tsumura et al. ............... 257/40 |
| 5,574,291 | A  | * | 11/1996 | Dodabalapur et al. ......... 257/40 |
| 6,248,666 | B1 | * | 6/2001 | Frijlink et al. ............... 438/689 |
| 2003/0122121 | A1 | * | 7/2003 | Yamazaki et al. ............. 257/40 |

OTHER PUBLICATIONS

Huitema et al., "Plastic transistors in active-matrix displays," Nature, vol. 414, Dec. 6, 2001, p. 599.*

* cited by examiner

*Primary Examiner*—Kenneth A Parker
*Assistant Examiner*—Anthony Ho
(74) *Attorney, Agent, or Firm*—Leydig, Voit & Mayer, Ltd.

(57) ABSTRACT

The device of the invention comprises a thin film transistor of an organic semiconductor material. This semiconductor material is patterned by applying first a protective layer and thereafter a photoresist. As a result hereof, the transistor of the invention (A) shows a very low leakage current and a low threshold voltage in comparison with prior art transistors (B,C).

4 Claims, 2 Drawing Sheets

ELECTRONIC ARRANGEMENT INCLUDING A THIN FILM TRANSISTOR HAVING ACTIVE AND PROTECTIVE LAYERS STRUCTURED IN A SAME TWO-DIMENSIONAL PATTERN

CROSS-REFERENCE TO RELATED APPLICATIONS

This patent application is the national stage, and claims the priority, of International Patent Application No. PCT/IB04/50154, filed Feb. 26, 2004, which designates the U.S., and which claims the benefit of European Patent Application No. 03100574.7, filed Mar. 7, 2003.

AREA OF THE INVENTION

The invention relates to a method of manufacturing an electronic arrangement, comprising a thin film transistor with an active layer containing an organic semiconductor material, said method comprises the following steps:
applying the active layer on a substrate;
applying, exposing and developing a photoresist, and
patterning the active layer in accordance with the pattern in the applied photoresist.

BACKGROUND

The invention additionally relates to an electronic arrangement comprising a thin film transistor with a source electrode and a drain electrode, which are separated from each other by a channel, and a gate electrode, which are separated from the channel by dielectric material, said arrangement having a substrate, on one side of which there is: an active layer, which contains an organic semiconductor material, and in which the channel is located; a first electrode layer, in which the source electrode and the drain electrode are defined; an intermediate layer of dielectric material, and a second electrode layer, in which the gate electrode is defined, said gate electrode, when perpendicularly projected onto the first electrode layer, substantially overlapping the channel.

Such an arrangement and such a method are known from H.E.A. Huitema et al. Nature 414, 599 (2001). The known arrangement is a display device with an electro-optical layer of liquid crystalline material. To prevent leakage currents between adjacent transistors the active layer is structured. The active layer in the known arrangement contains polythenylene-vinylene as a semiconductor material and has gold/PEDOT electrodes.

SUMMARY OF THE INVENTION

Experiments have shown, that a thin film transistor with a structured active layer has different characteristics than a comparable thin film transistor with a non-structured active layer. Although the leakage current between the transistors at gate voltages of more than 20 V is reduced substantially, it is found that there is a considerable threshold voltage. In practice this means, that to operate the device a very high gate voltage must be applied continuously. This is very disadvantageous for the associated power consumption, a feature which is particularly relevant for portable devices.

As such, it is a primary object of the invention to provide a method, of the type mentioned in the introduction, whereby an arrangement is realized, which displays both a low leakage current between neighboring thin film transistors and a lower threshold voltage.

This object is achieved by applying a protective layer on the active layer, upon which the photoresist is placed; and by patterning the protective layer and the active layer in accordance with the pattern defined in the photoresist.

It has surprisingly been found that, with a protective layer, an arrangement is achieved in which the leakage current and the threshold voltage are significantly lowered. A first hypothesis for the occurrence of the raised threshold voltage in the measured transistors of the prior art was that the conductors in the photoresist were doping the active layer. Doping in the active layer results namely in an increased conductivity. This in turn results in a higher gate electrode voltage being required to suppress the resultant conductivity. The protective layer in the arrangement of the invention can however be a very thin layer with an amorphous structure. As such, the conductors in the photoresist could simply diffuse through this protective layer. This is particularly true as the curing of the photoresist is carried out under a raised temperature. In further steps of the manufacturing process of—in particular—a display device, higher temperatures are used too. As such, apparently, one or more unexplained effects occur. It is then surmised that the photoresist patterns act as an additional and uncontrolled electrode. Because there is no longer contact between this electrode and the active layer in the device according to the invention, due to the presence of the protective layer, this electrode is no longer active. The fact that the protective layer in question can be very thin, apparently has no influence on this.

To ensure correct operation of the transistor it is extremely desirable here, that the protective layer is an electrically non-conductive material; suitable materials are semiconductor materials and in particular electrically insulating materials. Suitable materials include, inter alia polymethylmethacrylate, polyvinylalcohol, polyvinylphenol, polyacrylate, polystyrene, polyvinyl chloride, polyesters, polyethers, benzocyclobutene, polyimide, epoxides, glass-filled polymers and inorganic dielectrics. It is then advantageous that the protective layer material is applied in a solvent, in which the semiconductor material of the active layer is not soluble or only slightly soluble. In practice, it is advantageous to choose a material that is not soluble in the solvent of the photoresist. Furthermore, this resistance to dissolving in the photoresist can be realized by curing the material after applying same on the active layer. If this is desirable, from the point of view of solubility, it goes without saying that the protective layer may be comprised of two partial layers of different materials.

An advantage of the method of the invention is that temperature treatments for different layers can be carried out in one single heating step. Such heat treatments are needed, for example, for transforming a precursor material into the organic semiconductor material and for curing of the photoresist.

Examples of suitable organic semiconductors include polythenylene-vinylene, poly-3-alkylthiophenes, such as poly-3-pentylthiophene, poly-3-hexylthiophene, poly-3-heptylthiophene; pentacene, phtalocyanine, benzodithiophene, tetracyanonaphthoquinone, tetrakismethylanimoethylene, oligothiophenes, polyarylamines, polyphenylene-vinylenes, polyfuranylene-vinylenes, polypyrrol, polyphenylene, polyfluorene, polyacetylene, polyfurane, polyaniline, functionalized bucky balls, co-polymers and compounds of these, and co-polymers within which a semiconductor with a limited conjugated length is integrated. In addition, substituted variants of these polymer materials may be used too. Examples of substitutes are alkyl and alkoxy groups and ring shaped groups, such as alkylenedioxy groups. The preferred choices for such groups are $C_1$ to $C_{10}$ alkyl, alkoxy or alkylene.

In an advantageous embodiment the active layer contains a mixture of a carrier material and the semiconductor material. It has been found, that in this way, the adhesion of the protective layer to the active layer can be improved. In practice it appears, that some semiconductor materials, in particular oligomers, such as pentacene and oligothiophene, demonstrate a poor adhesion and a bad mechanical stability. By adding a small or greater amount of carrier material, this mechanical stability is significantly improved. This means that the active layers can be applied more easily by means of spin coating and that it is easier to deposit layers on these active layers. An active layer as such is known from non pre-published application number PCT-IB02/03940 (PHNL010691). By using such a compound in combination with the protective layer, the active layer can be structured with such oligomers as the semiconductor material. Up until now, it was not easily possible to realize this in an industrially feasible manner. It is important hereby, that the carrier material is not soluble in the solvent which is used for the material in the protective layer.

In a further advantageous embodiment the active layer and the protective layer are structured by means of dry etching. In dry etching, which is also known as reactive ion etching, solvents are not used; in this way undesirable effects, such as swelling, are avoided. In a still further advantageous embodiment a metal electrode layer, which also serves as an etch stopping layer, is included between the active layer and the substrate. The preferred metal for this is a precious metal such as Au or Ag.

In an advantageous embodiment a source electrode and drain electrode for the thin film transistor are defined in a first electrode layer, before the active layer is applied. In addition, an intermediate layer of dielectric material is applied, and a gate electrode for the thin film transistor is defined in a second electrode layer of electrically conductive material. In this way, a thin film transistor with a bottom-gate structure is obtained. In the alternative top-gate structure, the gate electrode is placed on the protective layer or on the photoresist. This gives the limitation that the protective layer must also be suitable for use as a gate dielectric. Furthermore, in this case, the intermediate layer has the same pattern as the semiconductor layer, which results in a greater resistance for the vertical interconnects. In addition, when the gate electrode is placed prior to the application of the photoresist, an additional layer of electrically conductive material must be used for filling the vertical interconnects. When the gate electrode is placed after application of the photoresist, a two-layer dielectric is created.

The method of the invention can be used very successfully for realizing a large number of thin film transistors at the same time. It is furthermore advantageous that the thin film transistors form part of a display device, as already described in WO01/15233. Instead of a liquid crystalline electro-optical layer, also a different type of electro-optical layer may then be used, such as an electrophoretic layer.

A second object of the invention is to provide an arrangement of the type mentioned in the introduction, with a low leakage current and a low threshold voltage. This object is achieved, by having the side of the active layer which side is turned away from the substrate, in contact with a protective layer, whereby said layers are structured in the same pattern. This structure, which can be obtained by the method of the invention, gives the desired result.

In an advantageous embodiment the thin film transistor has a bottom-gate structure; in this case the second electrode layer is located between the first electrode layer and the substrate. This has the aforementioned advantages. In a still further embodiment a photoresist, which does not need to be removed later, is used in the same pattern before structuring. This seems to have a positive influence on the lifespan of the thin film transistors. Furthermore it is advantageous when the source and drain electrode have a so-called interdigitated structure. The preferred resolution of these electrodes and the intervening channel is in the order of 0.5-5 μm. Preferably, the thin film transistors are present in large numbers and can be interconnected in the desired pattern to form an integrated circuit.

In a particularly advantageous embodiment, the thin film transistor is a component of the first display element; and there are further display elements with thin film transistors present, where said first and further display elements are arranged in a matrix. In this case, the arrangement is a display device with several display elements—also known as pixels. It is particularly important for a display device that the leakage current between adjacent transistors is extremely low.

BRIEF DESCRIPTION OF THE DRAWINGS

These and other aspects of the invention are apparent from and will be elucidated with reference to the embodiments described hereinafter.

In the drawings.

DETAILED DESCRIPTION OF THE DRAWINGS

Figure 1:
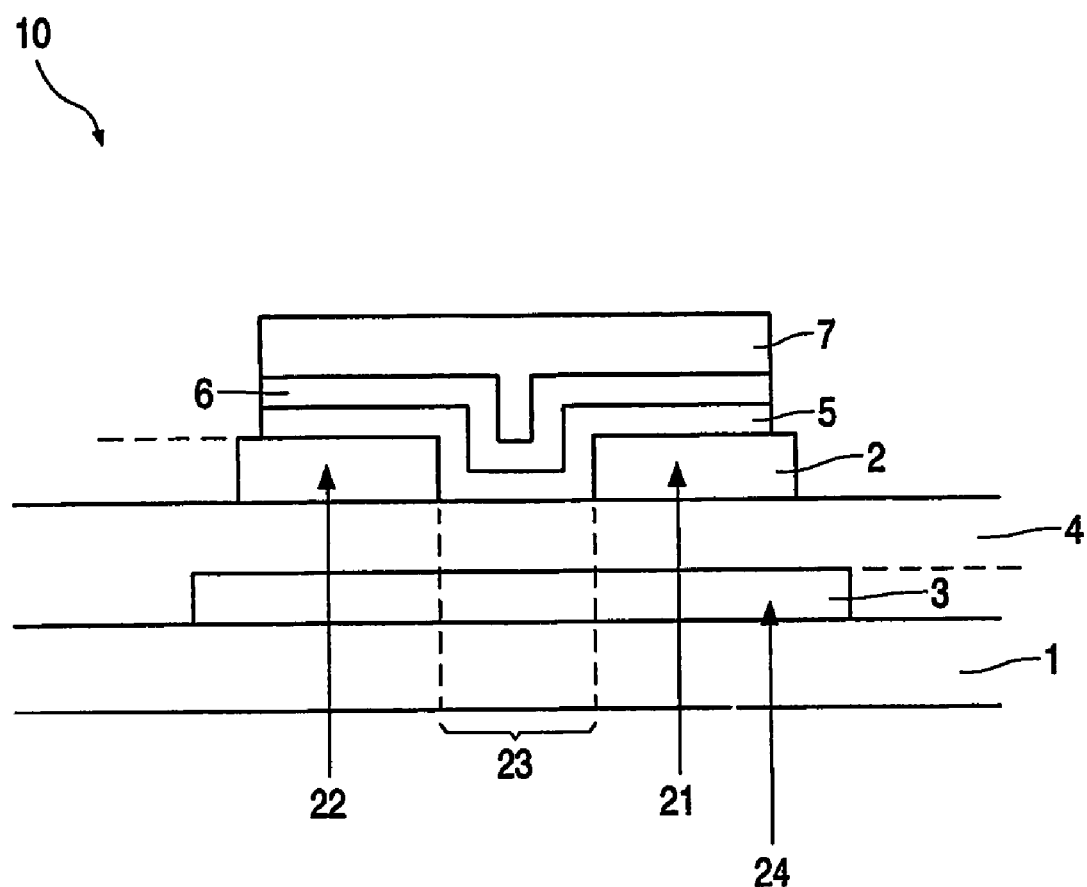
FIG. 1 shows a schematic cross section of the arrangement in accordance with the invention.

The thin film transistor 10 shown schematically and not to scale in FIG. 1, comprises an electrically insulating substrate 1, upon which there is a source electrode 21, a drain electrode 22, while said electrodes 21, 22 are separated from each other by a channel 23 and are defined in the first electrode layer 2. In addition, there is a second electrode layer 3 on the substrate 1, within which a gate electrode 24 is defined. When the gate electrode 24 is parallel projected onto the first electrode layer 2, the gate electrode 24 substantially overlaps the channel 23. Furthermore, there is an intermediate layer 4 and an active layer 5 which contains a semiconductor material.

Said layers 2,3,4,5 are present on the substrate 1 in the following order of second electrode layer 3, intermediate layer 4, first electrode layer 2 and active layer 5. To planarize the substrate there is an insulating planarization layer of polyvinylalcohol—which is not shown. The second electrode layer 3 contains Au and is patterned as required, in a known way, by means of an exposed and developed photosensitive resist. Between the second electrode layer 3 and the intermediate layer 4, a—not illustrated—mono-layer of $CH_3$—$(CH_2)_{15}$—SH can be applied to prevent the formation of pinholes in the intermediate layer 4. The intermediate layer 4 contains a photo-active organic dielectric, such as benzocyclobutene, polyimide, polyvinylphenol or a photoresist, in this case the photoresist HPR504. The first electrode layer 2 contains gold in this case. The first electrode layer 2 is applied by means of vaporization and photolithographically structured in known manner. On the first electrode layer 2, the active layer 5 of poly-3-hexylthiophene is applied with a thickness of 50 nm. At least a portion of the semiconductor layer 5 is in the channel 23.

According to the invention, there is a protective layer 6 on the active layer 5, which protective layer in this example contains polymethylmethacrylate (PMMA) and is 40 nm thick. When the active layer is applied by spinning in chloroform, ethylmethylketone is used as the solvent for the protective layer. A photoresist 7, in this case CK6020L, is applied to the protective layer by means of spin coating. This is supplied in a safe-solvent version. After exposure of the photoresist 7 by means of UV radiation (λ=365 nm), the photoresist is dried at 90° C. After a drying step at 120° C. for a period of 1 minute, the protective layer 6 and the active layer 5 are patterned by means of reactive ion etching. Hereby, the first electrode layer 2 serves as an etch stopping layer.

Figure 2:
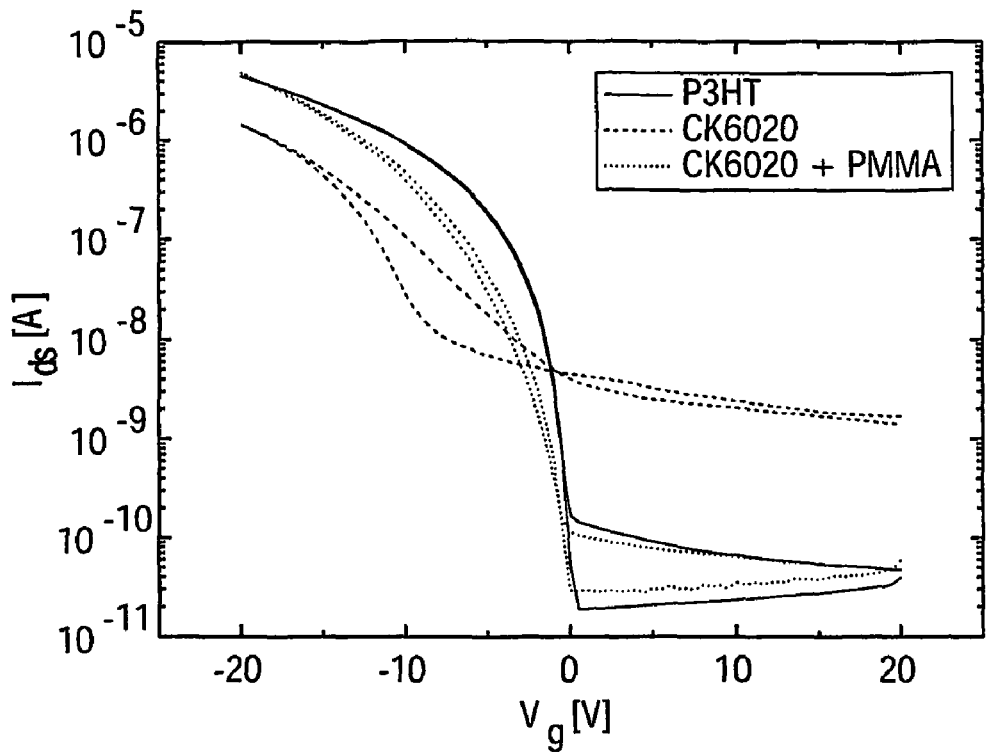
FIG. 2 shows results of measurements which were performed on the arrangement in accordance with the invention and known arrangements.

FIG. 2 shows a graph in which the current $I_d$ (in A) between the source and gate electrodes 21,22 is plotted as a function of the voltage on the gate electrode 24. Because of the p-type character of the organic semiconductor material, current flows when negative voltages are applied to the gate electrode. In other examples of embodiments, also an n-type semiconductor material, or an active layer with n-type and p-type characteristics can be used, as described in the non pre-published application EP03100177.9 (PHNL030112). The solid line shows the original characteristics, the lowest dotted line shows the result without protective layer 6, while the uppermost dotted line shows the result with protective layer 6.

Figure 3:
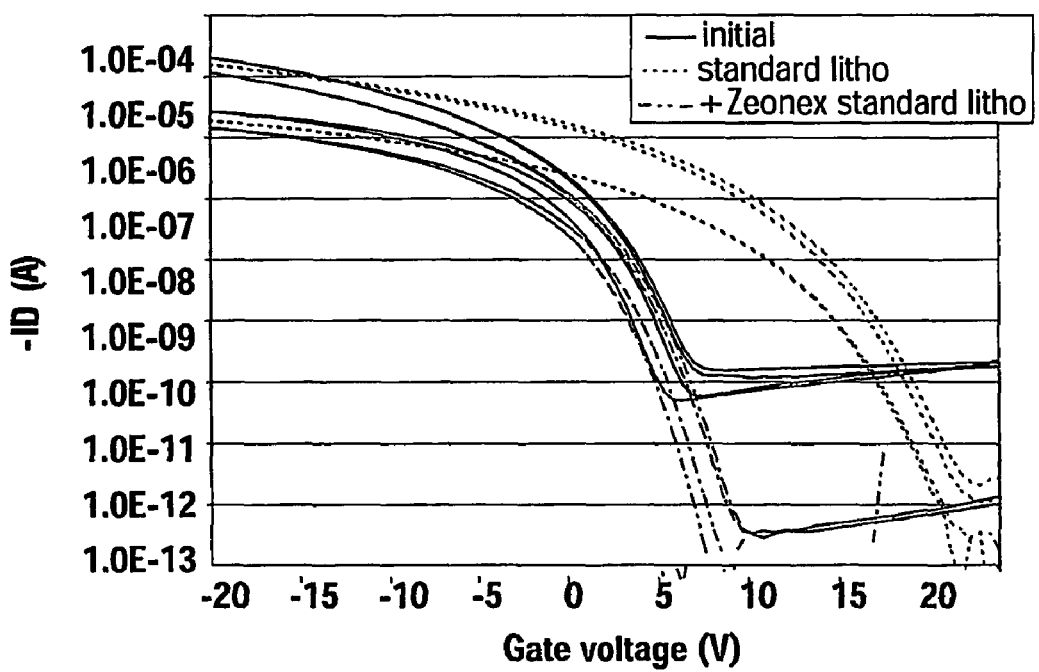
FIG. 3 shows results of measurements which were performed on the arrangement in accordance with the invention and known arrangements, and in embodiments using different materials.

FIG. 3 shows the same graph as FIG. 2, but for different materials. In this case, pentacene was used as the semiconductor material. A precursor material of this (with a tetrachlorocyclohexadine bond as leaving group) was applied as an active layer with polystyrene as the carrier material. This was subsequently converted to pentacene at 200° C. As a protective layer, the commercially available material Zeonex was applied by spinning, with cyclohexane as the solvent. HPR504 was used as the photoresist. The carrier material was included here in an amount of 1 percent by weight. The solvent used was dichloromethane. The solid line shows the original characteristics without structuring and without upper layers. The rightmost dotted line in the graph shows the result when a protective layer 6 is not used. The other dotted line shows the result when the active layer is structured.

The invention claimed is:

1. An electronic arrangement comprising a thin film transistor with a source electrode and a drain electrode, which are separated from each other by a channel, and a gate electrode, which is separated from the channel by means of dielectric material, said arrangement having:
    a substrate, on one side of which there is:
    an active layer, which comprises an organic semiconductor material, and within which the channel is located;
    a first electrode layer, within which the source electrode and the drain electrode are defined;
    an intermediate layer of dielectric material; and
    a second electrode layer, within which the gate electrode is defined, said gate electrode, when perpendicularly projected onto the first electrode layer, substantially overlapping the channel;
    characterized in that a side of the active layer facing away from the substrate is in contact with a protective layer, the protective layer being a substantially electrically non-conductive material, and which active and protective layers are structured in a same two-dimensional pattern, the protective layer and same two-dimensional pattern structure providing a thin film transistor arrangement with a lowered leakage current and lower threshold voltage;
    the thin film transistor is a component of a first display element; and
    further display elements with thin film transistors are present, which first and further display elements are arranged in a matrix.

2. The electronic arrangement as claimed in claim 1, characterized in that the active layer contains a carrier material and the protective layer contains an organic material, the carrier material and the organic material differing from each other.

3. The electronic arrangement as claimed in claim 1, characterized in that the second electrode layer is located between the substrate and the first electrode layer.

4. The electronic arrangement of claim 1 wherein the active layer contains a mixture of a carrier material and a semiconductor material.

\* \* \* \* \*